(12) United States Patent
Albrecht et al.

(10) Patent No.: US 8,772,911 B2
(45) Date of Patent: Jul. 8, 2014

(54) SEMICONDUCTOR DIODE AND METHOD FOR PRODUCING A SEMICONDUCTOR DIODE

(75) Inventors: Tony Albrecht, Bad Abbach (DE); Markus Maute, Alteglofsheim (DE); Martin Reufer, Reken (DE); Heribert Zull, Regensburg (DE)

(73) Assignee: OSRAM Opto Semiconductors GmbH, Regensburg (DE)

( * ) Notice: Subject to any disclaimer, the term of this patent is extended or adjusted under 35 U.S.C. 154(b) by 21 days.

(21) Appl. No.: 13/580,646

(22) PCT Filed: Feb. 10, 2011

(86) PCT No.: PCT/EP2011/051925
§ 371 (c)(1),
(2), (4) Date: Aug. 22, 2012

(87) PCT Pub. No.: WO2011/101280
PCT Pub. Date: Aug. 25, 2011

(65) Prior Publication Data
US 2012/0319299 A1      Dec. 20, 2012

(30) Foreign Application Priority Data
Feb. 22, 2010   (DE) .......................... 10 2010 002 204

(51) Int. Cl.
*H01L 29/06*    (2006.01)
(52) U.S. Cl.
USPC ................... 257/625; 257/E29.329; 257/452; 257/618; 257/624; 438/978

(58) Field of Classification Search
CPC ....................................................... H01L 23/36
USPC ............. 257/E29.327, E21.352, E29.329, 79, 257/170, 328, 335, 367, 452, 466, 471, 496, 257/618, 623–625; 438/48, 524, 570, 978
See application file for complete search history.

(56) References Cited

U.S. PATENT DOCUMENTS

| | | | | |
|---|---|---|---|---|
| 4,030,943 A | * | 6/1977 | Lee et al. ....................... | 438/122 |
| 5,663,581 A | | 9/1997 | Holm et al. | |
| 5,841,197 A | * | 11/1998 | Adamic, Jr. ................... | 257/777 |
| 6,278,136 B1 | | 8/2001 | Nitta | |
| 6,649,823 B2 | * | 11/2003 | Zuppero et al. ............... | 136/252 |
| 6,782,032 B2 | * | 8/2004 | Kondow et al. ................ | 372/92 |
| 7,535,089 B2 | * | 5/2009 | Fitzgerald ..................... | 257/684 |
| 7,777,278 B2 | * | 8/2010 | Hirler et al. ................... | 257/367 |
| 7,842,974 B2 | * | 11/2010 | Zhu ............................... | 257/201 |

(Continued)

FOREIGN PATENT DOCUMENTS

| | | |
|---|---|---|
| DE | 207 288 | 2/1984 |
| DE | 246 199 | 5/1987 |

(Continued)

*Primary Examiner* — Chris Chu
(74) *Attorney, Agent, or Firm* — Cozen O'Connor

(57) ABSTRACT

A semiconductor diode has a first semiconductor layer (102) of a first conductivity type and a second semiconductor layer of a second conductivity type having a doping. The second semiconductor layer has a vertical electrical via region (106) which is connected to the first semiconductor layer and in which the doping is modified in such a way that the electrical via region (106) has the first conductivity type. A method for producing such a semiconductor diode is described.

6 Claims, 2 Drawing Sheets

(56) References Cited

U.S. PATENT DOCUMENTS

| | | | |
|---|---|---|---|
| 7,898,004 B2* | 3/2011 | Wu et al. | 257/194 |
| 8,173,894 B2* | 5/2012 | Zuppero et al. | 136/252 |
| 8,237,198 B2* | 8/2012 | Wu et al. | 257/194 |
| 8,519,473 B2* | 8/2013 | Meiser et al. | 257/329 |
| 2009/0212398 A1* | 8/2009 | Suzuki et al. | 257/618 |

FOREIGN PATENT DOCUMENTS

| | | |
|---|---|---|
| DE | 42 05 584 | 9/1992 |
| DE | 10 2008 051 048 | 4/2010 |
| EP | 0 487 876 | 10/1991 |
| EP | 0 905 797 | 8/1998 |
| WO | WO 02/13281 | 2/2002 |

* cited by examiner

SEMICONDUCTOR DIODE AND METHOD FOR PRODUCING A SEMICONDUCTOR DIODE

RELATED APPLICATIONS

This is a U.S. National Phase Application under 35 USC 371 of International Application PCT/EP2011/051295 filed on Feb. 10, 2011.

This application claims the priority of Germany Application No. 10 2010 002 204.7 filed Feb. 22, 2010, the entire content of which is hereby incorporated by reference.

FIELD OF THE INVENTION

The present invention relates to a semiconductor diode and a method for producing a semiconductor diode.

BACKGROUND OF THE INVENTION

Semiconductor diodes are used in myriad different applications. One particular application is a light-emitting diode (LED).

The LED is a semiconductor component which generates optical radiation, such as light, from electrical energy by means of electroluminescence. A semiconductor, for example a III-V semiconductor, is typically provided in this case. Epitaxial layers grown on a substrate are possible as a semiconductor layer sequence. The semiconductor layer sequence includes a suitable active zone for generating electromagnetic radiation. The active zone can contain a pn junction, a double heterostructure or a quantum well structure such as a single quantum well (SQW) structure or multi quantum well (MQW) structure for generating radiation.

In a LED it is particularly desirable to keep one radiation out-coupling side as free from shadows as possible in order to achieve good light extraction.

SUMMARY OF THE INVENTION

One object of the present invention is to provide a semiconductor diode which can be electrically contacted by way of a single side of the semiconductor layer sequence.

Different embodiment variants of the semiconductor diode have a first semiconductor layer of a first conductivity type and a second semiconductor layer of a second conductivity type having a doping. The second semiconductor layer has a vertical electrical via region which is connected to the first semiconductor layer and in which the doping is modified in such a way that the electrical via region has the first conductivity type.

A semiconductor diode is accordingly provided, the two semiconductor layers of which can be contacted from one side of the semiconductor diode. This is achieved by modifying the doping in the second semiconductor layer. The second semiconductor layer as such remains preserved. The planar structure, in particular the electrical via region, is not structured mechanically, but rather the doping in the second semiconductor layer is modified locally. The electrical via region can be modified arbitrarily according to the desired structure.

The possibility of electrically contacting the semiconductor diode by way of the side of the second semiconductor layer means that the side of the first semiconductor layer can be kept free of contact elements. This is particularly advantageous in connection with a LED, because it enables the side of the first semiconductor layer to serve as a radiation out-coupling side without the necessity of providing contact elements that cause shadowing. It furthermore allows other types of package to be used, such as what is termed a wafer level package, for example, or also multichip packages, such as what is referred to as a system-in-package, in which the semiconductor diode is mounted onto a further semiconductor component. Thus, for example, a LED can be mounted on a semiconductor component containing a driver circuit, and both the driver circuit and the LED can be accommodated in a single package.

A significant advantage of the semiconductor diode is yielded in terms of simple process management during the production of the electrical via region. The latter is produced by means of a local modification to the doping of the second semiconductor layer sequence. This removes the need for complex, labor-intensive and/or time-consuming process control steps, such as are known for example from document [1], in the course of the production of so-called via structures as an interlayer connection means. Most notably, there is no longer any need to etch structures during the production of the described semiconductor diode. The process flow sequence is simplified on account of fewer lithographic steps and on account of fewer subsequent process steps for compensating for topographical differences. As a result it is possible to provide in a simple and cost-effective manner a semiconductor diode having one side that is free of contact elements.

In some embodiment variants the first conductivity type corresponds to an n-doping and the second conductivity type corresponds to a p-doping. It is especially advantageous in this case that a p-doping in particular is easy to modify or, as the case may be, destroy.

In some embodiment variants the first semiconductor layer is electrically contacted by way of the electrical via region and a first contact. The second semiconductor layer is electrically contacted by a second contact.

In some embodiment variants the electrical via region is produced by locally damaging the doping in the second semiconductor layer. The damage can be caused by a multiplicity of methods. These include, for example: ion implantation, ion bombardment (in the case of a gallium nitride (GaN) semiconductor, by bombardment with argon (Ar) ions for example), the introduction of defects or impurities into the semiconductor or an electrical passivation by introducing hydrogen into the semiconductor. The latter can be realized for example through exposure to a plasma or through annealing in a hydrogen atmosphere. In this case the interventions cited act directly on the doping or on the charge carriers in the second semiconductor layer. The critical point, however, is that the diode characteristic of the pn junction is destroyed locally in the electrical via region.

In some embodiment variants the electrical via region is arranged along a lateral surface of the second semiconductor layer. As a result the diode characteristic is destroyed along a lateral surface of the semiconductor diode. Consequently, no electrical potential drops in this region, which means in particular that no transport of ions caused by an electrical field can be induced. In particularly preferred embodiment variants the electrical via region runs peripherally along the lateral surfaces of the second semiconductor layer.

In some embodiment variants the semiconductor diode is embodied as an optoelectronic diode, e.g. as a LED.

In some embodiment variants the semiconductor diode is embodied as a thin-film semiconductor component.

Different embodiment variants of the method for producing a semiconductor diode comprise:
  providing a first semiconductor layer of a first conductivity type;

providing a second semiconductor layer of a second conductivity type;

locally modifying a doping of the second semiconductor layer such that an electrical via region is produced in the second semiconductor layer for the purpose of electrically contacting the first semiconductor layer.

By means of the method a semiconductor diode which needs to be contacted from the side of the second semiconductor layer only is provided in a simple and efficient manner.

In some embodiment variants for modifying the doping of the second semiconductor layer, the latter is damaged. In some exemplary embodiments the damage is caused by one of the following processes, or by a combination of individual processes from among said processes:

ion implantation, ion bombardment (in the case of a gallium nitride (GaN) semiconductor, by bombardment with argon (Ar) ions for example), introduction of defects or impurities into the semiconductor, or electrical passivation by introducing hydrogen into the second semiconductor layer, for example through exposure to a plasma or through annealing in a hydrogen atmosphere.

BRIEF DESCRIPTION OF THE DRAWINGS

Various exemplary embodiments of the semiconductor diode and of the method for producing a semiconductor diode are explained in more detail below with reference to the drawings. In the figures, the first digit(s) of a reference numeral indicate the figure in which the reference numeral is used for the first time. The same reference numerals are used for like or like-acting elements or properties in all of the figures.

In the figures.

DETAILED DESCRIPTION OF THE DRAWINGS

Figure 1:
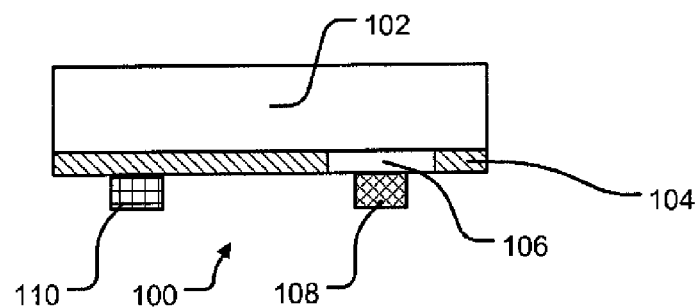
FIG. 1 shows a schematic cross-section through a first exemplary embodiment of a semiconductor diode.

FIG. 1 shows a schematic cross-section through a first exemplary embodiment of a semiconductor diode 100. The semiconductor diode 100 has a semiconductor layer sequence comprising a first semiconductor layer 102 and a second semiconductor layer 104. The semiconductor layer sequence has been produced for example by means of a thin-film method. This is described for example in document [2] or document [3], the disclosure of which is hereby incorporated by reference. The first semiconductor layer 102 has a first conductivity type achieved by means of doping with a first dopant material. In the first exemplary embodiment, the first semiconductor layer 102 is an n-doped semiconductor, e.g. an Si-doped GaN semiconductor. The second semiconductor layer 104 has a second conductivity type achieved by means of doping with a second dopant material. In the second exemplary embodiment, the second semiconductor layer is a p-doped semiconductor, e.g. a GaN semiconductor doped with magnesium (Mg).

In order to be able to contact the first semiconductor layer 102 by way of the side of the second semiconductor layer 104 the second semiconductor layer 104 has at least one electrical via region 106 in which the doping of the second semiconductor layer 104 has been modified by means of the second dopant material. This is accomplished for example by means of a local plasma process which acts on the electrical via region 106. For example, the second semiconductor layer 102 is exposed in the electrical via region 106 to an arbitrary plasma, e.g. an Ar plasma. The doping of the second semiconductor layer 104 is damaged by the plasma. The damage can equally be caused by a multiplicity of other methods. These include, for example: ion implantation, ion bombardment (in the case of the GaN semiconductor, by bombardment with Ar ions for example), the introduction of defects or impurities into the second semiconductor layer 104 or an electrical passivation by introducing hydrogen into the second semiconductor layer 104. The latter can be realized for example through local exposure of the second semiconductor layer 104 to a plasma or through annealing in a hydrogen atmosphere. In this case the cited interventions act directly on the doping or the charge carriers in the second semiconductor layer 104. The critical point, however, is that the diode characteristic of the pn junction is destroyed locally in the electrical via region 106. More donors or charge carriers are available in the vicinity of the impurities, with the result that an n-conducting electrical via region 106 is produced in the p-conducting second semiconductor layer 104.

Thus, the entire semiconductor diode 100 can be electrically contacted from the side of the second semiconductor layer 104. Toward that end, a first contact terminal 108 is connected to the electrical via region 106. A second contact terminal 110 is connected directly to the second semiconductor layer 104. It proves to be advantageous in particular that the electrical via region 106 produced as a result of damage exhibits a high-impedance transition to the undamaged second semiconductor layer 104 in the lateral direction. There is scarcely any lateral or transverse charge carrier transport, with the result that the vast majority of a current introduced by way of the electrical via region 106 is supplied to the first semiconductor layer 102. It is therefore unnecessary to provide a special means of electrical insulation between the electrical via region 106 and the undamaged second semiconductor layer 104. Furthermore, in particular a homogeneous illumination pattern can be achieved in this way for a light-emitting semiconductor diode 100.

Figure 2:
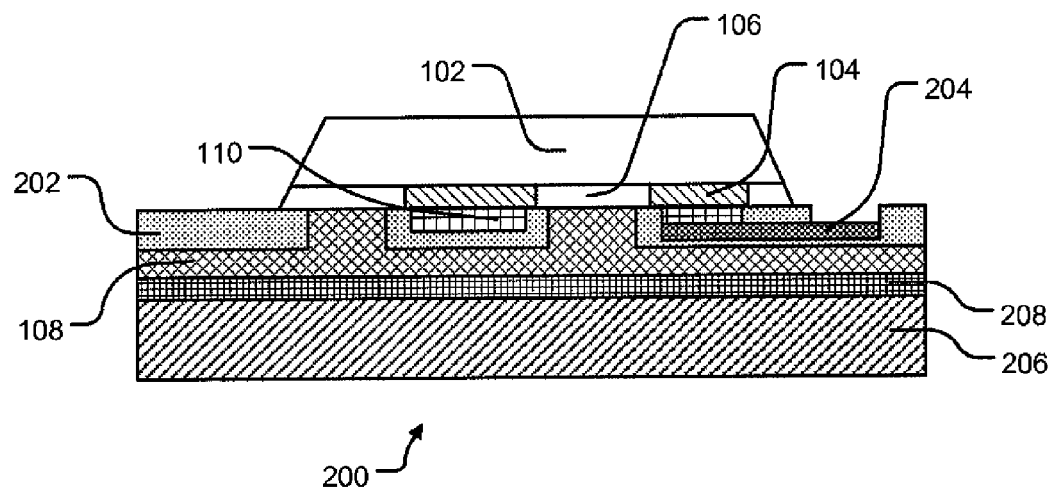
FIG. 2 shows a schematic cross-section through a second exemplary embodiment of a semiconductor diode.

FIG. 2 shows a schematic cross-section through a second exemplary embodiment of a semiconductor diode 200. The semiconductor diode 200 has a semiconductor body consisting of a semiconductor layer sequence. The semiconductor body constitutes a mesastructure. The semiconductor layer sequence comprises a first semiconductor layer 102 and a second semiconductor layer 104. In this case the first semiconductor layer 102 is an n-doped semiconductor material as described in the first exemplary embodiment, while the second semiconductor layer 104 is a p-doped semiconductor material as described in the first exemplary embodiment.

In order to be able to contact the first semiconductor layer 102 by way of the side of the second semiconductor layer 104, the second semiconductor layer 104 has at least one electrical via region 106 in which the doping of the second semiconductor layer 104 has been modified by means of the second dopant material. This is realized for example by means of a local plasma process which acts on the electrical via region 106. For example, the second semiconductor layer 102 is exposed in the electrical via region 106 to an arbitrary plasma, for example an argon (Ar) plasma. The doping of the second semiconductor layer 104 is damaged by the plasma; in particular defects are introduced into the semiconductor material. More donors are available in the vicinity of the defects, with the result that an n-conducting electrical via region 106 is produced in the p-conducting second semiconductor layer 104.

The semiconductor body is mounted on a terminal structure. The terminal structure has a first contact 108 which is electrically connected to the electrical via region 106. The first contact 108 is usually a good electrical conductor, such as e.g. a metal layer. At the same time the first contact 108 serves as a mirror for electromagnetic radiation generated in the semiconductor body in order to obtain a higher level of radiation out-coupling efficiency by way of the side of the semiconductor body (the "n-side") disposed opposite the terminal structure. The first contact 108 therefore consists of an efficient radiation-reflecting conductor, such as silver (Ag), for example, or an alloy containing silver.

The terminal structure additionally has a second contact 110 which is electrically connected to the second semiconductor layer 104. Like the first contact 108, the second contact 110 is a good electrical conductor, such as e.g. a metal layer. The second contact 110 likewise serves as a mirror for increasing the radiation out-coupling by way of the n-side. For this reason it also consists of an efficient radiation-reflecting conductor, such as silver (Ag), for example, or an alloy containing silver. In order to avoid a short circuit, the first contact 108 and the second contact 110 are electrically insulated from each other by means of a dielectric 202. The dielectric contains for example silicon dioxide ($SiO_2$) or silicon nitride (SiN) or consists of one of these materials. It can serve at the same time as a passivation of the first contact 108 and of the second contact 110. Degradation of the contacts, for example as a result of oxidation and ion migration, is avoided in this way.

Contact terminals or bond pads, as they are called, are provided for contacting the contacts, by way of which bond pads an electrical contact is established by means of a bonding wire or other suitable electrical connections. For example, a contact terminal 204 is provided for electrical contacting to the second contact 110. The bond pad 204 consists of an electrical conductor which is maximally inert toward other influences, and which can be easily attached, e.g. by way of a soldered joint, to an electrical connection. Examples of suitable materials include gold (Au), platinum (Pt) or titanium (Ti), or alloys which contain one or more of these materials.

The semiconductor body is mounted together with the terminal structure onto a substrate 206. They are attached to the substrate 206 by means of a jointing solder 208. The jointing solder 208 contains a metal or a metal alloy having a low melting point.

The electrical via region 106 extends along the outer edges of the mesa lateral surfaces (mesa edges) of the semiconductor body. As a result no contact surfaces between an n-doped and a p-doped semiconductor region are present on the lateral surfaces. The absence of a p-n transition on the outside faces prevents in particular effects such as a migration of $Ag^+$ ions from the second contact 110 into the semiconductor body. The migration of the material contained in the second contact 110 is induced by means of an external electrical field, with ions of a metal moving along the field lines of the field. Consequently, ions can for example penetrate into the semiconductor body and cause damage there, for example by modifying the electrical properties of a semiconductor layer sequence.

Figure 3:
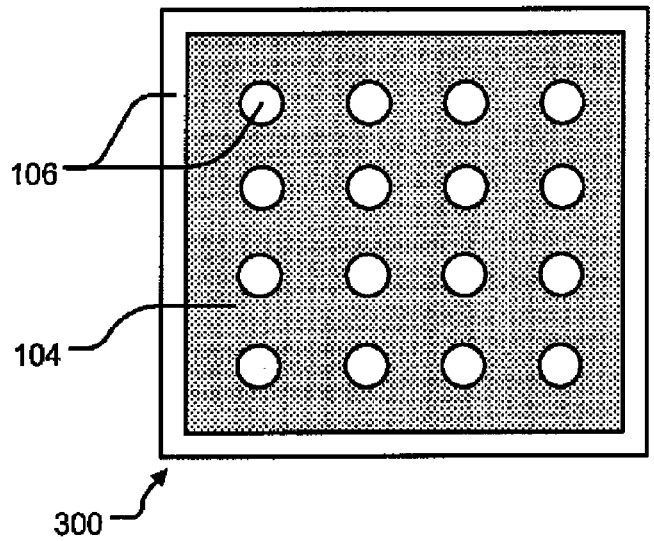
FIG. 3 shows the schematic layout of a contact side of the second semiconductor layer of a third exemplary embodiment of a semiconductor diode.

FIG. 3 shows the schematic layout of a contact side 300 of the second semiconductor layer of a third exemplary embodiment of a semiconductor diode. The contact side 300 comprises a side of the second semiconductor layer 104. A plurality of electrical via regions 106 are incorporated in the second semiconductor layer 104 as a result of damage caused to the doping of the second semiconductor layer 104. The electrical via regions 106 extend peripherally along the outside of the contact side 300. Additionally provided is a plurality of individual plated-through hole regions 106 arranged separated from one another. A supply of current to, and hence for example a luminous density of, the semiconductor diode can be influenced by the size and arrangement of the plated-through hole regions. In addition to the illustrated arrangement in a square network structure, arrangements for example in hexagonal structures or other suitable structures are also conceivable.

Figure 4:
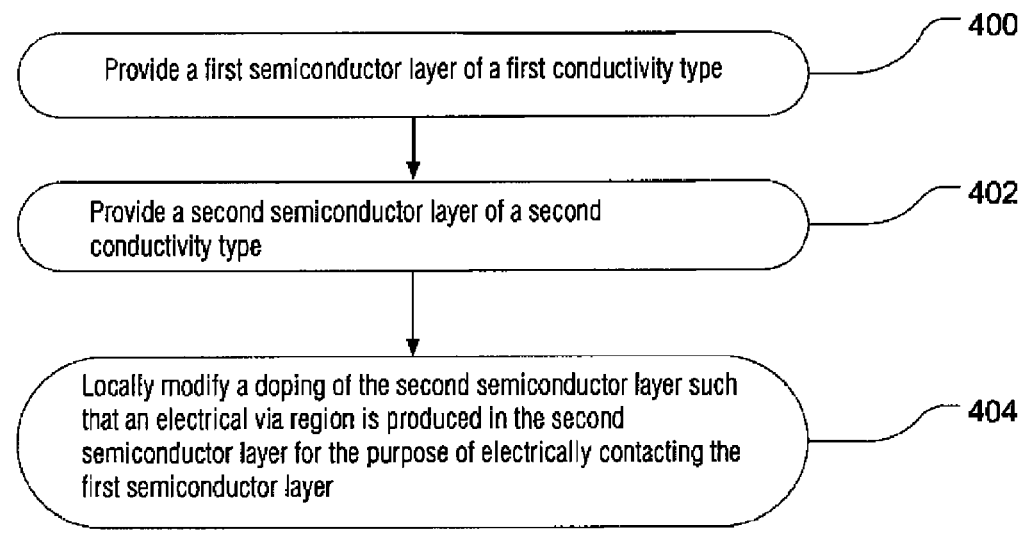
FIG. 4 shows the schematic process flow of a method for producing a semiconductor diode.

FIG. 4 shows the schematic process flow of a method for producing a semiconductor diode.

In this case a first semiconductor layer of a first conductivity type is provided, for example by means of an epitaxial growth process, in a first method step 400. In a second method step 402, a second semiconductor layer of a second conductivity type is provided, for example by means of an epitaxial growth process on the first semiconductor layer. The first semiconductor layer can in this case be an n-doped semiconductor for example, while the second semiconductor layer is a p-doped semiconductor. In other embodiment variants the second semiconductor layer is provided first, and the first semiconductor layer thereafter.

In a third method step 404, a doping of the second semiconductor layer is modified locally, with the result that an electrical via region for contacting the first semiconductor layer is produced in the second semiconductor layer. The doping can be modified already before the first semiconductor layer is provided.

In order to modify the doping of the second semiconductor layer, the latter can be damaged. The damage can be effected by means of a multiplicity of processes. These include, for example:

- ion implantation,
- ion bombardment (in the case of a gallium nitride (GaN) semiconductor, by bombardment with argon (Ar) ions for example),
- introduction of defects or impurities into the semiconductor or
- electrical passivation by introducing hydrogen into the second semiconductor layer, for example through exposure to a plasma or through annealing in a hydrogen atmosphere.

The semiconductor diode and the method for producing a semiconductor diode have been described with reference to several exemplary embodiments in order to illustrate the underlying inventive concept. In this case the exemplary embodiments are not limited to specific feature combinations. Even if certain features and embodiments have been described only in connection with a particular exemplary embodiment or individual exemplary embodiments, they can in each case be combined with other features from other exemplary embodiments. It is equally possible to omit or add individual features illustrated in exemplary embodiments or special embodiments insofar as the general technical teaching remains realized.

The invention claimed is:

1. A semiconductor diode comprising:
   a semiconductor body having a first semiconductor layer of a first conductivity type, and a second semiconductor layer of a second conductivity type having a doping, wherein the second semiconductor layer has a vertical electrical via region which is connected to the first semiconductor layer and in which the doping is modified such that the electrical via region has the first conductivity type, and wherein the electrical via region extends along the outer edges of the mesa lateral surfaces of the semiconductor body.

2. The semiconductor diode as claimed in claim 1, wherein the first conductivity type corresponds to an n doping and the second conductivity type corresponds to a p-doping.

3. The semiconductor diode as claimed in claim 1, wherein the first semiconductor layer is electrically contacted by way of the electrical via region and a first contact and wherein the second semiconductor layer is electrically contacted by a second contact.

4. The semiconductor diode as claimed in claim 1, wherein the electrical via region is produced by locally damaging the doping in the second semiconductor layer.

5. The semiconductor diode as claimed in claim 1, which is embodied as an optoelectronic diode.

6. The semiconductor diode as claimed in claim 1, which is embodied as a thin-film semiconductor component.

\* \* \* \* \*